United States Patent
Lee et al.

(10) Patent No.: US 7,506,284 B2
(45) Date of Patent: Mar. 17, 2009

(54) EVENT DRIVEN SWITCH LEVEL SIMULATION METHOD AND SIMULATOR

(75) Inventors: Seuk-Whan Lee, Gyeonggi-do (KR); Moon-Hyun Yoo, Gyeonggi-do (KR); Joon-Ho Choi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 364 days.

(21) Appl. No.: 11/336,744

(22) Filed: Jan. 19, 2006

(65) Prior Publication Data
US 2006/0190862 A1   Aug. 24, 2006

(30) Foreign Application Priority Data
Jan. 26, 2005   (KR)   .............. 10-2005-0007224

(51) Int. Cl.
*G06F 17/50*   (2006.01)
(52) U.S. Cl. ............ 716/4; 716/5; 716/6; 703/13; 703/14; 703/15; 703/16
(58) Field of Classification Search ........ 716/4–6; 713/13–16
See application file for complete search history.

(56) References Cited

U.S. PATENT DOCUMENTS

| | | | | |
|---|---|---|---|---|
| 5,446,676 A | * | 8/1995 | Huang et al. | 703/19 |
| 5,481,484 A | * | 1/1996 | Ogawa et al. | 703/14 |
| 5,666,288 A | * | 9/1997 | Jones et al. | 716/17 |
| 5,751,593 A | * | 5/1998 | Pullela et al. | 716/6 |
| 5,852,445 A | * | 12/1998 | Yoshikawa et al. | 345/440 |
| 5,872,952 A | * | 2/1999 | Tuan et al. | 714/724 |
| 5,880,967 A | * | 3/1999 | Jyu et al. | 716/6 |
| 6,012,833 A | * | 1/2000 | Yoshikawa | 700/121 |
| 6,304,998 B1 | * | 10/2001 | Kamiya et al. | 716/4 |
| 6,523,154 B2 | * | 2/2003 | Cohn et al. | 716/6 |
| 6,779,163 B2 | * | 8/2004 | Bednar et al. | 716/7 |
| 6,820,048 B1 | * | 11/2004 | Bhutani et al. | 703/15 |
| 6,869,808 B2 | * | 3/2005 | Yonezawa et al. | 438/14 |
| 6,897,697 B2 | * | 5/2005 | Yin et al. | 327/210 |
| 6,920,417 B2 | * | 7/2005 | Lescot et al. | 703/13 |
| 6,983,432 B2 | * | 1/2006 | Hayes | 716/4 |
| 6,990,646 B2 | * | 1/2006 | Yoshikawa | 716/6 |

(Continued)

FOREIGN PATENT DOCUMENTS

JP   11-175576   7/1999

(Continued)

OTHER PUBLICATIONS

English language abstract of Korean Publication No. 1998-042220.

(Continued)

*Primary Examiner*—Naum B Levin
(74) *Attorney, Agent, or Firm*—Marger Johnson & McCollom, P.C.

(57) ABSTRACT

A method for simulating an integrated circuit includes performing a power supply voltage tuning operation to find a power supply voltage at which a simulation of the integrated circuit at an operating frequency passes a functional requirement, identifying a weak signal node based on the simulation result, and performing a size tuning operation on the weak signal node of the integrated circuit.

16 Claims, 6 Drawing Sheets

U.S. PATENT DOCUMENTS

| | | | |
|---|---|---|---|
| 7,000,214 B2 * | 2/2006 | Iadanza et al. | 716/18 |
| 7,086,023 B2 * | 8/2006 | Visweswariah | 716/6 |
| 7,096,140 B2 * | 8/2006 | Nozuyama et al. | 702/117 |
| 7,114,136 B2 * | 9/2006 | Chase et al. | 716/4 |
| 7,124,377 B2 * | 10/2006 | Catthoor et al. | 716/2 |
| 7,203,877 B2 * | 4/2007 | Yacobucci | 714/726 |
| 7,346,869 B2 * | 3/2008 | Tai et al. | 716/5 |
| 2003/0177452 A1 * | 9/2003 | Chen | 716/2 |
| 2003/0233622 A1 * | 12/2003 | Nystrom et al. | 716/1 |
| 2004/0019860 A1 * | 1/2004 | Lee | 716/4 |
| 2005/0267728 A1 * | 12/2005 | Maher et al. | 703/25 |
| 2006/0230372 A1 * | 10/2006 | Baader et al. | 716/5 |
| 2007/0164785 A1 * | 7/2007 | He | 326/41 |

FOREIGN PATENT DOCUMENTS

| | | |
|---|---|---|
| JP | 2000-269280 | 9/2000 |
| JP | 2002-009300 | 1/2002 |
| JP | 2004-133525 | 4/2004 |
| JP | 2004-319828 | 11/2004 |
| KR | 1998-042220 | 8/1998 |

OTHER PUBLICATIONS

English language abstract of Japanese Publication No. 11-175576.
English language abstract of Japanese Publication No. 2000-269280.
English language abstract of Japanese Publication No. 2002-009300.
English language abstract of Japanese Publication No. 2004-133525.

* cited by examiner

FIG. 8

|  | Tr. size | Load | Delay | VDD | FUCTION |
|---|---|---|---|---|---|
| INTCLK | 120/48 | 87ff | 545ps | 1.6V | PASS |
| PCAS | 50/20 | 100ff | 470ps | | |
| INTCLK | 120/48 | 75ff | 610ps | 1454.05mV | FAIL |
| PCAS | 50/20 | 95ff | 615ps | | |
| INTCLK | 100/38 | 68ff | 620ps | 1454.05mV | PASS |
| PCAS | 50/20 | 95ff | 615ps | | |

EVENT DRIVEN SWITCH LEVEL SIMULATION METHOD AND SIMULATOR

CROSS-REFERENCE TO RELATED PATENT APPLICATION

This application claims the benefit of Korean Patent Application No. 10-2005-0007224, filed on Jan. 26, 2005, in the Korean Intellectual Property Office, the disclosure of which is incorporated herein in its entirety by reference.

BACKGROUND OF THE INVENTION

1. Field of the Invention

This disclosure relates to electronic design automation (EDA), and more particularly, to a method and apparatus for simulating semiconductor integrated circuits.

2. Description of the Related Art

There are a variety of principal standard techniques for optimizing circuit design and chip layout which provide the best results while meeting fixed costs among other design conditions. These techniques include varying the chip size, power consumption of the chip, and the operating speeds of various functions executed in the chip. Optimization of circuit design and chip layout is performed using various analyses for estimating the relative importance of various design standards using workstations or other computer systems running design programs.

The most important design standards to meet are functional and timing requirements of integrated circuits. However, a simulation of a full-chip circuit to inspect the timing of a memory integrated circuit may require several hours. Thus, it is impossible to simulate the full-chip circuit in real time under various conditions such as process variations, operating voltage variations, and temperature variations. Accordingly, the memory circuit is simulated using limited sets of conditions.

SUMMARY OF THE INVENTION

An embodiment includes a method for simulating an integrated circuit includes performing a power supply voltage tuning operation to find a power supply voltage at which a simulation of the integrated circuit at an operating frequency passes a functional requirement, identifying a weak signal node based on the simulation result, and performing a size tuning operation on the weak signal node of the integrated circuit.

BRIEF DESCRIPTION OF THE DRAWINGS

The above and other features and advantages of the invention will become more apparent by describing in detail exemplary embodiments thereof with reference to the attached drawings in which:

FIG. 8 is a table representing a simulation result of the memory circuit of FIG. 7.

DETAILED DESCRIPTION OF THE INVENTION

Figure 1:
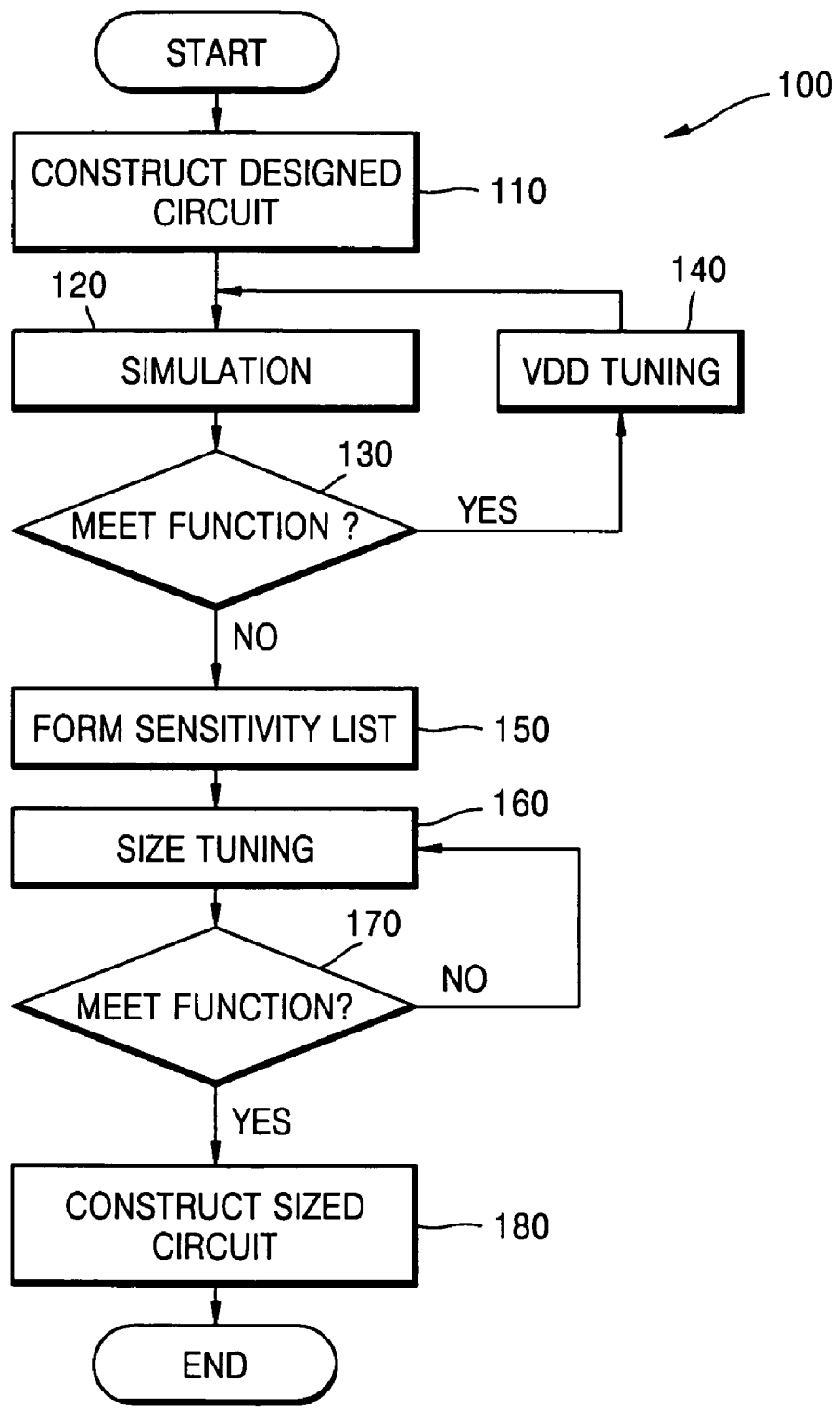
FIG. 1 is a flow chart showing an event driven switch level simulation method according to an embodiment.

Embodiments will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

FIG. 1 is a flow chart showing an event driven switch level simulation method 100 according to an embodiment. Referring to FIG. 1, the event driven switch level simulation method 100 optimizes an integrated circuit using the function sensitivity and timing sensitivity of each signal node in the integrated circuit. In 120, the simulation method 100 carries out a simulation on a circuit previously designed in 110. If the result of the simulation meets a functional requirement in 130, the simulation method 100 performs a VDD tuning operation in 140. If the simulation result does not meet the functional requirement in 130, the simulation method forms a sensitivity list of the circuit in operation 150. Subsequently, the simulation method 100 tunes the sizes of circuit components. For example, the size of transistors are tuned based on the sensitivity list in 160. Next, the circuit is simulated. If the simulation result meets the functional requirements in 170, a sized circuit is constructed in 180 and the simulation is finished. If the simulation result does not meet the functional requirements in 170, the size tuning operation is repeated in 160.

Figure 2:
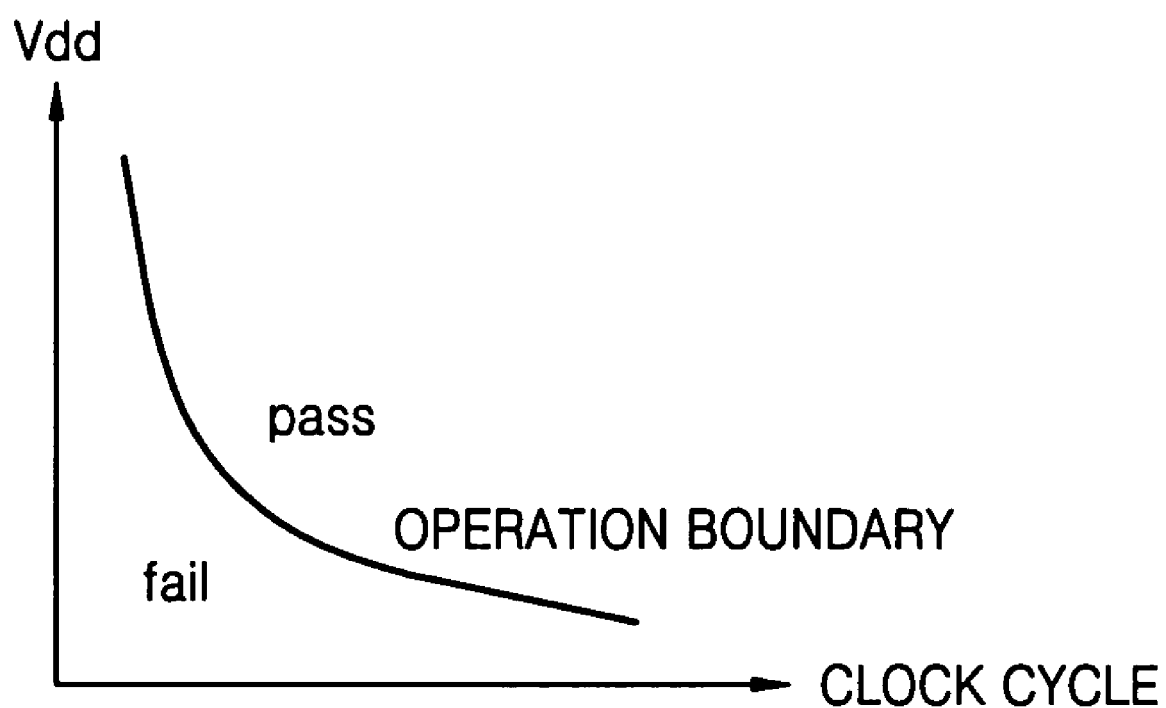
FIG. 2 is a graph showing an operation boundary line in response to a power supply voltage and an operating frequency.

FIG. 2 is a graph showing an operation boundary line in response to a power supply voltage and an operating frequency of a memory device. Referring to FIG. 2, the operating frequency of the memory device is high when the power supply voltage Vdd of the memory device is high, and the operating frequency is low when the power supply voltage Vdd is low. The VDD tuning operation finds the operating point of the power supply voltage Vdd at an arbitrary operating frequency.

Figure 3:
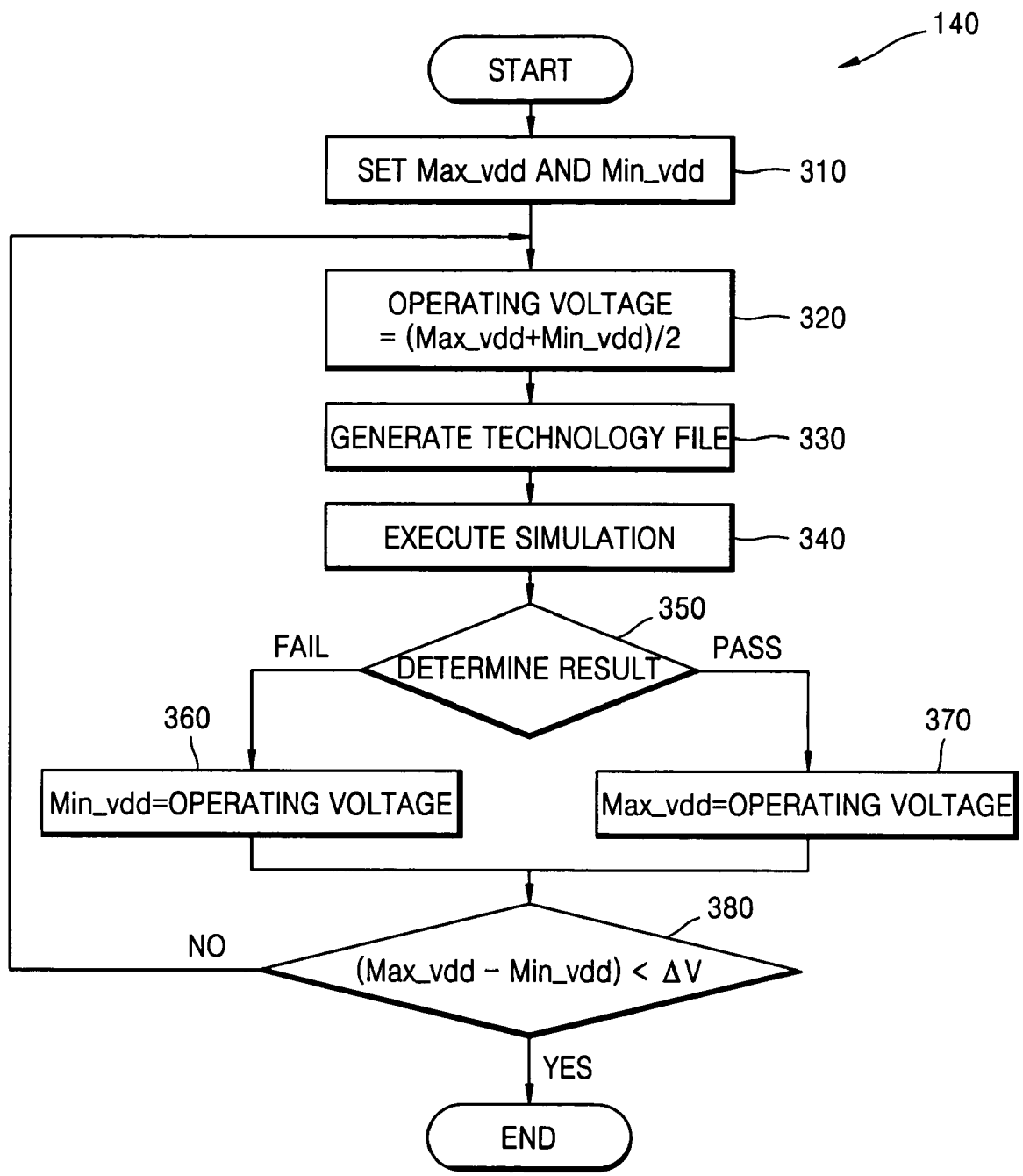
FIG. 3 is a flow chart showing the VDD tuning operation of FIG. 1.

FIG. 3 is a flow chart showing the VDD tuning 140 of FIG. 1. Referring to FIG. 3, the VDD tuning 140 sets a maximum power supply voltage Max_vdd and a minimum power supply voltage Min_vdd in 310, and sets a voltage corresponding to half the sum of the maximum power supply voltage Max_vdd and the minimum power supply voltage Min_vdd as an operating voltage in 320. Subsequently, the VDD tuning 140 generates a technology file for circuit parameter analysis in 330 and carries out a simulation using the technology file, a circuit netlist and a simulation vector in 340. If the simulation result fails in 350, the operating voltage is set to the minimum power supply voltage Min_vdd in 360. If the simulation result passes in 350, the VDD tuning operation sets the operating voltage to the maximum power supply voltage Max_vdd in 370. It is determined if the difference between the maximum power supply voltage Max_vdd and the minimum power supply voltage Min_vdd is within a predetermined voltage range DV in 380. If the difference between the power supply voltage Max_vdd and the minimum power supply voltage Min_vdd is within the predetermined voltage range DV, the VDD tuning is finished. If the voltage difference is not within the predetermined voltage range DV, the VDD tuning continues in 320.

Figure 4:
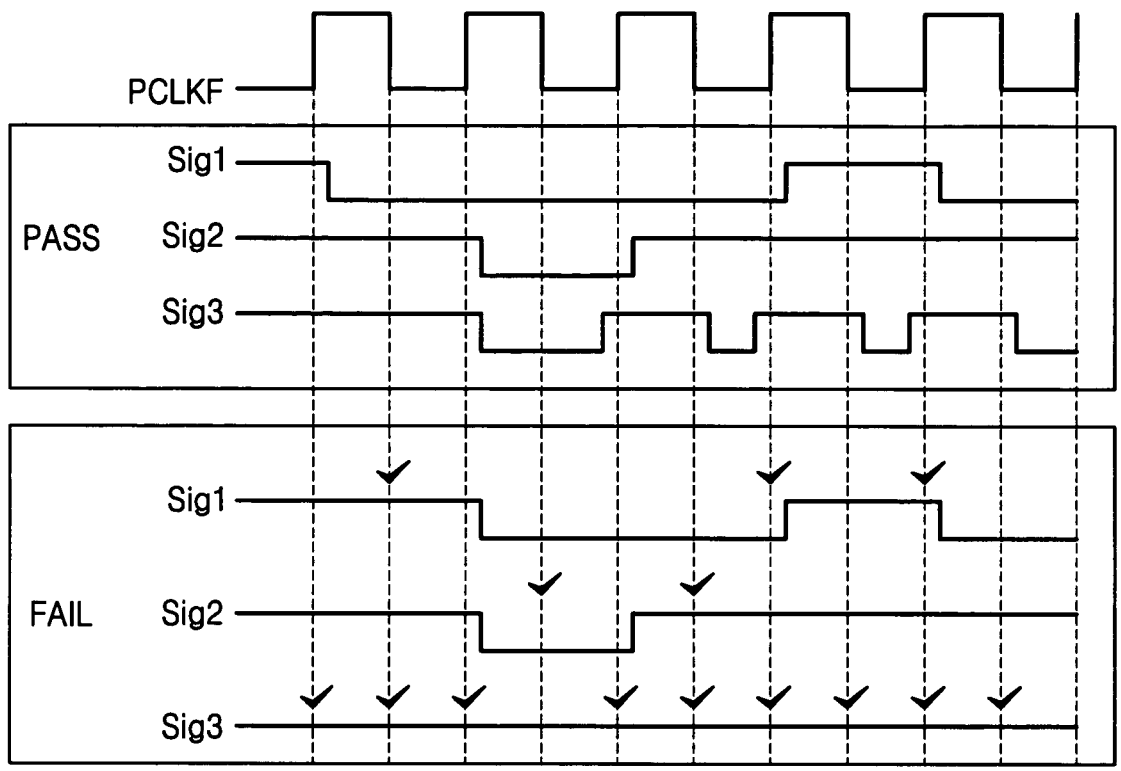
FIG. 4 is a timing diagram for explaining function sensitivity of signal nodes in a circuit.

FIG. 4 is a timing diagram for explaining function sensitivity of signal nodes in a circuit. FIG. 4 shows simulation result waveforms that passed and simulation result waveforms that failed, with respect to three signal nodes, Sig1, Sig2, and Sig3, based on a clock signal PCLKF. As can be seen by comparison of the simulation result waveforms that passed to the simulation result waveforms that failed, the first signal node Sig1 has a logic transition at three edges of the clock signal PCLKF, the second signal node Sig2 has a logic transition at two edges of the clock signal PCLKF, and the third signal node Sig3 has a logic transition at nine edges of the clock signal PCLKF. When the number of edges of the clock signal PCLKF at which each of the signal nodes, Sig1, Sig2, and Sig3, has logic transitions is counted, the function sensitivity list can be generated as follows.

TABLE 1

| Signal node name | The number of counts |
|---|---|
| Sig1 | 3 |
| Sig2 | 2 |
| Sig3 | 9 |

Referring to Table 1, the third signal node Sig3 has the highest probability of generating function failure. Accordingly, when the cause of the function failure of the third signal node Sig3 is analyzed and the third signal node is improved to obtain a correct function, even the possibility of function failure of the first and second signal nodes Sig1 and Sig2 may be removed.

Figure 5:
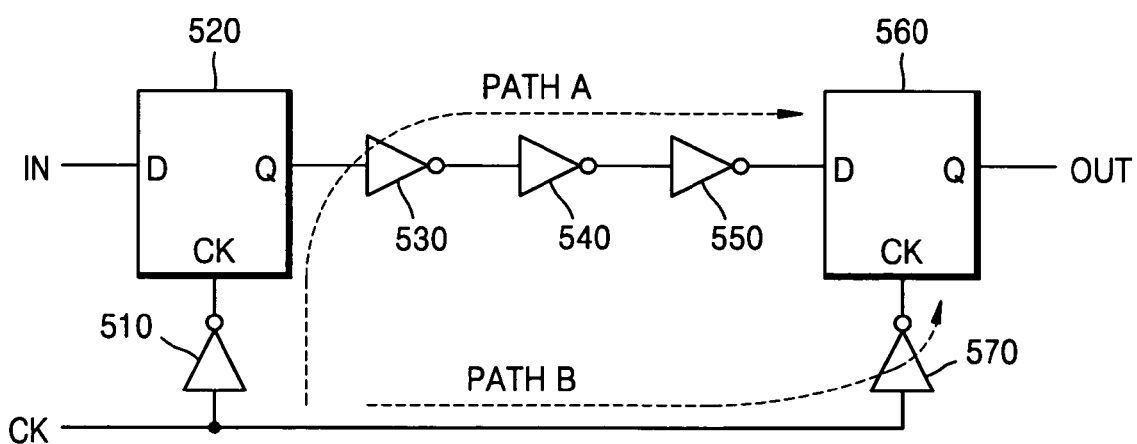
FIG. 5 is a diagram for explaining timing sensitivity of a circuit.

FIG. 5 is a diagram for explaining timing sensitivity of a circuit. Referring to FIG. 5, skew is generated between logic gates 510, 520, 530, 540 and 550 located on a data path A and a logic gate 570 placed on a clock path B. Thus, there is a high possibility of generating setup and hold timing violation in the logic gate 560. A weak circuit having a timing violation can be found by measuring a resistance variation with respect to an operating voltage variation. The resistance variation is defined as follows.

$$\Delta r = |\Delta t / \Delta c| \quad \text{[Equation 1]}$$

where $\Delta t$ represents a delay time variation, and $\Delta c$ represents load variations.

Figure 6:
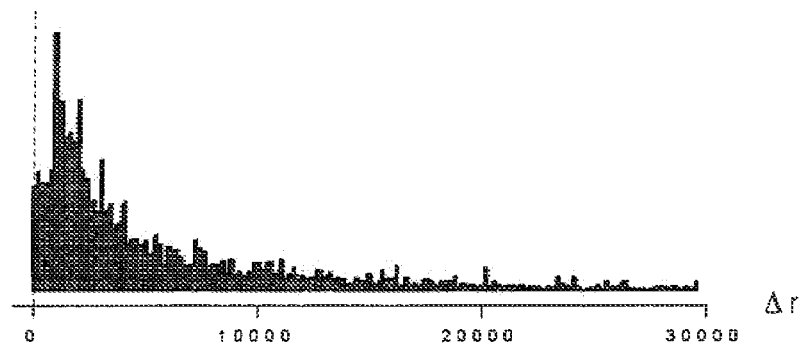
FIG. 6 is a graph showing resistance variations in signal nodes in a circuit.

FIG. 6 illustrates node resistance variations of a memory device. The memory device is simulated at operating voltages of 1.6V and 1.5V, and resistance variations of nodes at which node sensitivity is generated are calculated. FIG. 6 is a graph showing the resistance variations. The resistance variations with respect to 65,000 nodes are in the range of 0 through 30 kΩ. It can be known from FIG. 6 that a driver connected to a node having the largest resistance variation of 30 kΩ has the highest skew sensitivity.

Figure 7:
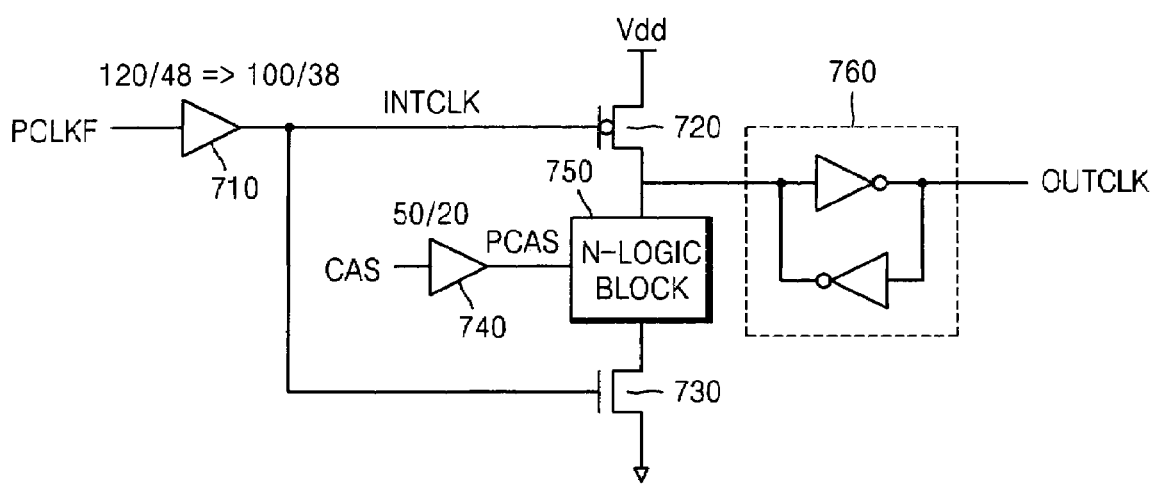
FIG. 7 is a circuit diagram of a memory device to which an embodiment of an event driven switch level simulation method is applied.

FIG. 7 is a circuit diagram of a memory device to which an embodiment of an event driven switch level simulation method is applied, and FIG. 8 is a table representing a simulation result of the memory circuit of FIG. 7. Referring to FIG. 7, the memory device includes a first driver 710 receiving a clock signal PCLKF to generate an internal clock signal INTCLK, a PMOS transistor 720 and an NMOS transistor 730 having gates receiving the internal clock signal INTCLK, a second driver 740 receiving a column address strobe (CAS) signal to generate an internal CAS signal PCAS, a logic block 750 receiving the internal CAS signal PCAS, and a latch 760 latching the output signal of the logic block 750 to generate an output signal OUTCLK.

The internal clock signal INTCLK must be input to the logic block after the internal CAS signal PCAS because the internal clock signal INTCLK functions as a power enable signal for the logic block 750.

FIG. 8 shows a simulation result obtained by simulating the memory device of FIG. 7 while varying an operating power supply voltage VDD. Referring to FIG. 8, the function of the memory device passes the simulation when the power supply voltage VDD is 1.6V but fails when the power supply voltage VDD is 1454.05 mV. That is, with a power supply voltage VDD of 1.6V, when a transistor size of the first driver 710 is 120/48 and a transistor size of the second driver 720 is 50/20, the load and delay time of the internal clock signal INTCLK are 87 ff and 545 ps, respectively, and the load and delay time of the internal CAS signal PCAS are 100 ff and 470 ps, respectively. Accordingly, the internal clock signal INTCLK is input to the logic block 750 after the internal CAS signal PCAS to result in function pass.

When the power supply voltage VDD is 1454.05 mV, the load and delay time of the internal clock signal INTCLK are 75 ff and 610 ps, respectively, and the load and delay time of the internal CAS signal PCAS are 95 ff and 615 ps, respectively. Accordingly, the internal clock signal INTCLK is input to the logic block 750 prior to the internal CAS signal PCAS resulting in function failure.

To solve the problem that the internal clock signal INTCLK is input to the logic block 750 prior to the internal CAS signal PCAS when the power supply voltage VDD is 1454.05 mV, the load of the internal clock signal INTCLK should be increased. Accordingly, the transistor size of the first driver 710 is changed to 100/38. Then, the load and delay time of the first driver 710 become 68 ff and 620 ps, respectively. The delay time 620 ps is larger than the delay time of the internal CAS signal PCAS, 615 ps, and thus the internal clock signal INTCLK is input to the logic block 750 after the internal CAS signal PCAS, resulting in function pass.

While the invention has been particularly shown and described with reference to exemplary embodiments thereof, it will be understood by those of ordinary skill in the art that various changes in form and detail may be made therein without departing from the spirit and scope of the invention as defined by the following claims.

What is claimed is:

1. A simulation method to find a power supply voltage for an integrated circuit, comprising:
    setting a maximum power supply voltage and a minimum power supply voltage;
    setting an operating voltage to a voltage corresponding to half the sum of the maximum power supply voltage and the minimum power supply voltage;
    generating a technology file for analyzing parameters of the integrated circuit;
    simulating using the technology file, a netlist of the integrated circuit, the operating voltage, and a simulation vector;
    setting the minimum power supply voltage to the operating voltage if the simulation result fails; and
    setting the maximum power supply voltage to the operating voltage if the simulation result passes.

2. The method of claim 1, further comprising repeating setting the operating voltage, generating the technology file, simulating, and setting the minimum or maximum power supply voltage until a difference between the minimum and maximum power supply voltages is less than a threshold.

3. A method for simulating an integrated circuit, comprising:
performing a power supply voltage tuning operation to find a power supply voltage at which a simulation of the integrated circuit at an operating frequency passes a functional requirement, including:
setting a maximum power supply voltage and a minimum power supply voltage;
setting an operating voltage to a voltage corresponding to half the sum of the maximum power supply voltage and the minimum power supply voltage;
generating a technology file for analyzing parameters of the integrated circuit;
simulating using the technology file, a netlist of the integrated circuit, the operating voltage, and a simulation vector;
setting the minimum power supply voltage to the operating voltage if the simulation result fails; and
setting the maximum power supply voltage to the operating voltage if the simulation result passes;
identifying a weak signal node based on a simulation result of the simulation; and
performing a size tuning operation on the weak signal node of the integrated circuit.

4. The method of claim 3, further comprising repeating setting the operating voltage, generating the technology file, simulating, and setting the minimum or maximum power supply voltage until a difference between the minimum and maximum power supply voltages is less than a threshold.

5. The method of claim 3, further comprising performing the power supply voltage tuning operation to find a failing power supply voltage at which a simulation of the integrated circuit at an operating frequency fails the functional requirement.

6. The method of claim 3, further comprising constructing the integrated circuit according to the simulated integrated circuit.

7. An integrated circuit manufactured according to the method of claim 6.

8. The method of claim 3, wherein identifying the weak signal node further comprises counting transitions of signal nodes of the integrated circuit.

9. The method of claim 3, wherein identifying the weak signal node further comprises calculating resistance variations of the signal nodes of the integrated circuit with respect to operating voltage variations.

10. The method of claim 9, wherein calculating the resistance variations of the signal nodes further comprises dividing delay time variations of the signal nodes, obtained as a simulation result in response to a variation in the operating voltage, by load variations of the signal nodes.

11. The method of claim 3, wherein the size tuning operation further comprises tuning the sizes of transistors connected to the weak signal node.

12. An apparatus for simulating an integrated circuit, comprising:
a power supply voltage tuning unit configured to perform a power supply voltage tuning operation to find a power supply voltage at which a simulation of the integrated circuit at an operating frequency passes a functional requirement;
a weak node identifying unit configured to identifying a weak signal node based on a simulation result of the simulation; and
a size tuning unit configured to perform size tuning on the weak signal node of the integrated circuit;
wherein the power supply voltage tuning unit is further configured:
to set a maximum power supply voltage and a minimum power supply voltage;
to set an operating voltage corresponding to half the sum of the maximum power supply voltage and the minimum power supply voltage as an operating voltage;
to generate a technology file for analyzing parameters of the integrated circuit;
to simulate using the technology file, a netlist of the integrated circuit, the operating voltage, and a simulation vector;
to set the operating voltage to the minimum power supply voltage if the simulation result fails; and
to set the operating voltage to the maximum power supply voltage if the simulation result passes.

13. The apparatus of claim 12, wherein the power supply voltage tuning unit is further configured to repeat setting the operating voltage, generating the technology file, simulating, and setting the operating voltage to one of the minimum and maximum power supply voltages until a difference between the minimum and maximum power supply voltages is less than a threshold.

14. The apparatus of claim 12, wherein the weak node identifying unit is further configured to count transitions of signal nodes of the integrated circuit.

15. The apparatus of claim 12, wherein the weak node identifying unit is further configured to calculate resistance variations of the signal nodes of the integrated circuit with respect to operating voltage variations.

16. The apparatus of claim 15, wherein the weak node identifying unit is further configured to calculate resistance variations by dividing delay time variations of the signal nodes, obtained as a simulation result in response to a variation in the operating voltage, by load variations of the signal nodes.

* * * * *